(12) United States Patent
Roberts et al.

(10) Patent No.: US 9,867,291 B2
(45) Date of Patent: Jan. 9, 2018

(54) EMBEDDED COPLANAR INTERCONNECT

(71) Applicant: Digi International Inc., Minnetonka, MN (US)

(72) Inventors: John Clark Roberts, Eagle Mountain, UT (US); Robert Wayne Ridgeway, Doonan (AU)

(73) Assignee: Digi Internationl Inc., Minnetonka, MN (US)

(*) Notice: Subject to any disclaimer, the term of this patent is extended or adjusted under 35 U.S.C. 154(b) by 58 days.

(21) Appl. No.: 13/682,485

(22) Filed: Nov. 20, 2012

(65) Prior Publication Data
US 2013/0135836 A1 May 30, 2013

Related U.S. Application Data

(60) Provisional application No. 61/565,198, filed on Nov. 30, 2011.

(51) Int. Cl.
*H05K 1/14* (2006.01)
*H05K 3/10* (2006.01)
*H05K 3/36* (2006.01)
*H05K 3/32* (2006.01)
*H01R 12/72* (2011.01)

(52) U.S. Cl.
CPC ............... *H05K 1/14* (2013.01); *H05K 3/10* (2013.01); *H05K 3/366* (2013.01); *H01R 12/722* (2013.01); *H05K 3/325* (2013.01); *H05K 2201/048* (2013.01); *Y10T 29/49126* (2015.01); *Y10T 29/49155* (2015.01)

(58) Field of Classification Search
CPC . H05K 1/14; H05K 3/10; H05K 3/366; H01R 12/722
USPC ........................................................ 361/792
See application file for complete search history.

(56) References Cited

U.S. PATENT DOCUMENTS

| 6,914,573 | B1* | 7/2005 | McCorkle | 343/767 |
| 2001/0052879 | A1* | 12/2001 | Gunee et al. | 343/702 |
| 2006/0119529 | A1* | 6/2006 | Krupezevic et al. | 343/793 |
| 2009/0009330 | A1* | 1/2009 | Sakama et al. | 340/572.1 |
| 2009/0015496 | A1* | 1/2009 | Liu | H01Q 9/0457 343/742 |
| 2009/0121944 | A1* | 5/2009 | Sotoudeh | H01Q 1/243 343/702 |
| 2009/0303132 | A1* | 12/2009 | Smith | H01Q 1/38 343/700 MS |
| 2010/0238076 | A1* | 9/2010 | Lin | H01Q 1/243 343/702 |
| 2011/0025580 | A1* | 2/2011 | Gray | H01R 24/50 343/892 |

* cited by examiner

*Primary Examiner* — Jenny L Wagner
*Assistant Examiner* — Michael P McFadden
(74) *Attorney, Agent, or Firm* — Fogg & Powers LLC

(57) ABSTRACT

A first printed circuit board (PCB) assembly can include an embedded electrical connector configured to be mechanically coupled to a corresponding tab-shaped portion of a second PCB assembly, such as to permit insertion of the tab-shaped portion of the second PCB assembly into the embedded electrical connector when the second PCB assembly is aligned in a specified orientation. In an example, the second PCB assembly can include an approximately planar conductive antenna.

24 Claims, 12 Drawing Sheets

EMBEDDED COPLANAR INTERCONNECT

CLAIM OF PRIORITY

This patent application claims the benefit of priority, under 35 U.S.C. Section 119(e), to U.S. Provisional Patent Application Ser. No. 61/565,198, titled "Embedded Coplanar Interconnect," filed Nov. 30, 2011, and which is hereby incorporated herein by reference in its entirety.

BACKGROUND

Various types of high-frequency connector assemblies are generally available, such as SMA, SMB, MCX, and MMCX-style connectors. Such connectors can provide mechanical and electrical coupling between printed circuit assemblies, or between a PCB assembly and another assembly, such as including an antenna. Such connector assemblies generally include surface-mount, end-launch, or through-hole mounting configurations, having a limited range of available characteristic impedances, such as fixed at 50 ohms or 75 ohms.

OVERVIEW

The design of high-frequency electrical systems, such as operating at hundreds of megahertz (MHz) or beyond, is generally constrained by the characteristic impedance of interconnects or other off-the-shelf components used in such systems. For example, transmission line structures or antennas can be designed to work using any of a wide range of characteristic impedances. But, in practice, such characteristic impedance ranges are generally constrained to conform to characteristics of available off-the-shelf connector designs.

Off-the-shelf connectors can also limit the usable range of operating frequencies, such as due to degradation of signal integrity. Such degradation can include reflective losses associated with impedance discontinuities caused by such connectors, or by signal attenuation of signals transmitted through such connectors (e.g., due to resistive or dielectric losses). Off-the-shelf connector configurations can have other disadvantages, such as undesirably consuming circuit board area with the connector housing, mechanical supports, or component placement "keep out" areas due to a height of the connector assembly (e.g., z-height-related constraints).

The present inventors have recognized, among other things, that an interconnect can be embedded into a printed circuit board (PCB) assembly, such as an interconnect formed using PCB materials or fabrication techniques. Such an embedded connector can thus avoid such fixed impedance constraints. For example, an embedded interconnect can be configured to provide a characteristic impedance that more closely approximates a conjugate match of a desired antenna configuration, even if such a match deviates from available off-the-shelf impedance values (e.g., such an interconnect or antenna configuration need not provide a 50-, 75- or 300-ohm real impedance). Such an embedded connector also eliminates the additional cost or complexity of using a bulky connector assembly.

The present inventors have also recognized that a board-to-board connection can be provided by such an embedded interconnect, such as providing mechanical and electrical coupling between a PCB assembly including communications circuitry, and another PCB assembly that can include an antenna. Such an embedded connector can include one or more through-hole features in a first PCB assembly, such as configured to align and mate with one or more tabs or other features included as a portion of a second PCB assembly, such as an antenna assembly. In an example, the first PCB assembly can be a rigid assembly, and the second PCB assembly can be a flexible assembly or a combination of rigid and flexible portions (e.g., the second PCB assembly can include a rigid-flex assembly).

The above overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
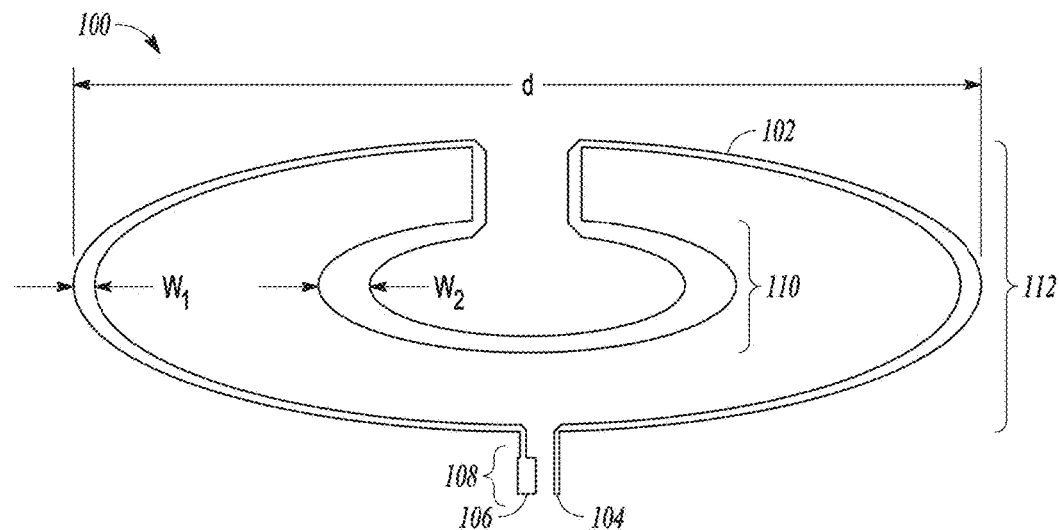
FIG. 1 illustrates generally an example of a planar antenna pattern, such as included as a portion of a PCB assembly.

FIG. 1 illustrates generally an example of a planar antenna pattern 100, such as can be included as a portion of a PCB assembly. The planar antenna pattern 100 can be formed as a conductive portion of the PCB assembly, such as including a conductive loop 102. The conductive loop 102 can include an outer loop portion 112 comprising a first conic section, and an inner loop portion 110 comprising a second conic section. In the example of FIG. 1, the first and second conic sections are elliptical, but can include other shapes, such as including a parabolic portion or a hyperbolic portion, or one or more other shapes. For example, as shown in FIG. 1 and in other examples below, the inner loop portion 110 can be located within a "footprint" bounded by the outer loop portion 112. The planar antenna pattern 100 need not be absolutely planar, and can be formed as a portion of a flexible assembly, or formed as a portion of an assembly including multiple layers.

In an example, a lateral width of the conductive loop 102 can vary along the conductive loop 102. In FIG. 1, such a lateral width can wider in a region along a major axis of the first or second conic sections, such as first width $w_1$ along a major axis of the outer loop portion 112, or a second width $w_2$ along a major axis of the inner loop portion 110. Such a width can be adjusted to provide a specified input impedance across a specified range of frequencies, such as broadening a usable range of operating frequencies as compared to using a conductive loop 102 having a constant or uniform lateral width.

In an example, the conductive loop 102 can include a first terminal 104, such as configured to be conductively coupled to a signal conductor included as a portion of an electrical connector or other feed, such as a transmission line or waveguide included as a portion of the PCB assembly. The conductive loop 102 can also include a second terminal 106, such as configured to be conductively coupled to a return conductor. One or more discrete or embedded matching components can be included in or nearby a feed region 108 of the planar antenna pattern 102.

In an example, the antenna pattern 100 can be configured to provide two or more specified ranges of operating frequencies, such as two different or two non-overlapping usable ranges of operating frequencies. For example, the antenna pattern 100 can provide a first usable operating frequency range meeting a specified return loss criterion, and a different second usable operating frequency range (e.g., a higher or "upper" frequency range), such as shown in the illustrative example of FIG. 4.

Figure 4:
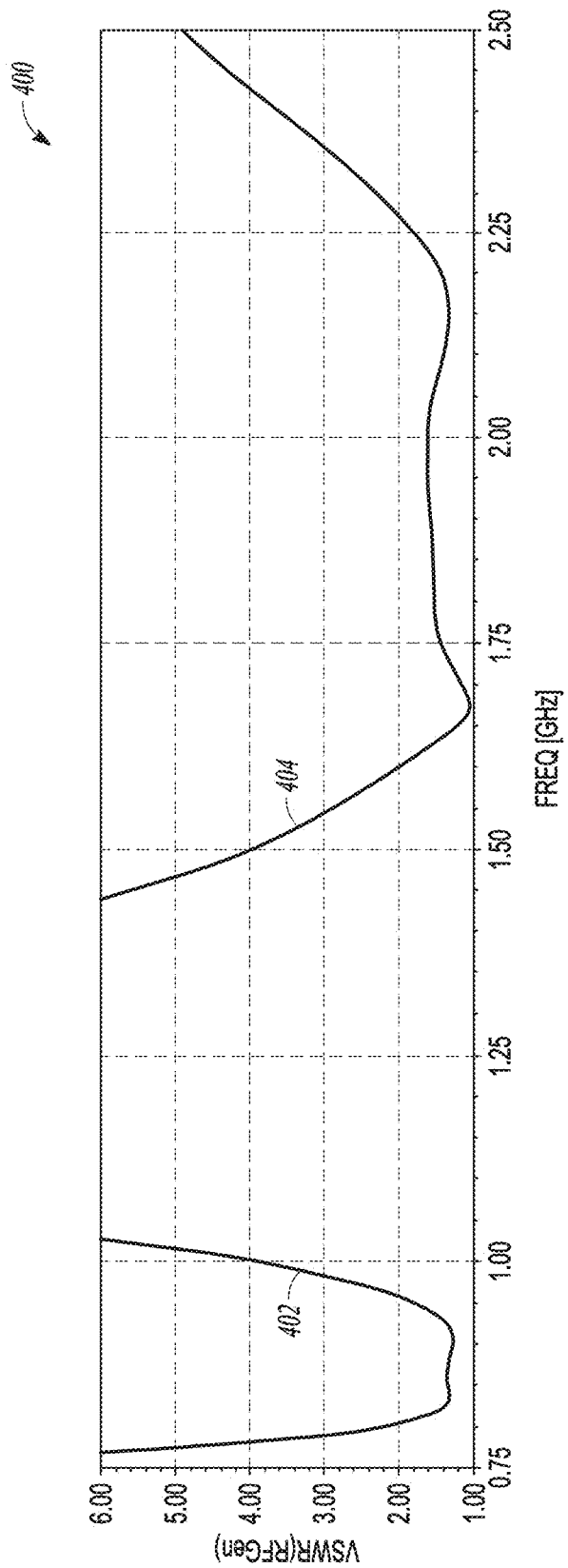
FIG. 4 illustrates generally an illustrative example of a voltage standing wave ratio (VSWR) simulated for the antenna configuration of FIG. 1.

A dimension of the major axis of the outer loop portion 112 can be represented by "d," and can be used to establish a center frequency of an upper band, such as including the second usable operating frequency range. In an illustrative example, if the antenna pattern 100 includes a conductive loop 102 backed by a dielectric material including a glass epoxy laminate, a dimension of 2.52 inches can provide a second usable operating frequency range from about 1.575 gigahertz (GHz) to about 2.170 GHz, such as shown in FIG. 4.

Figure 2:
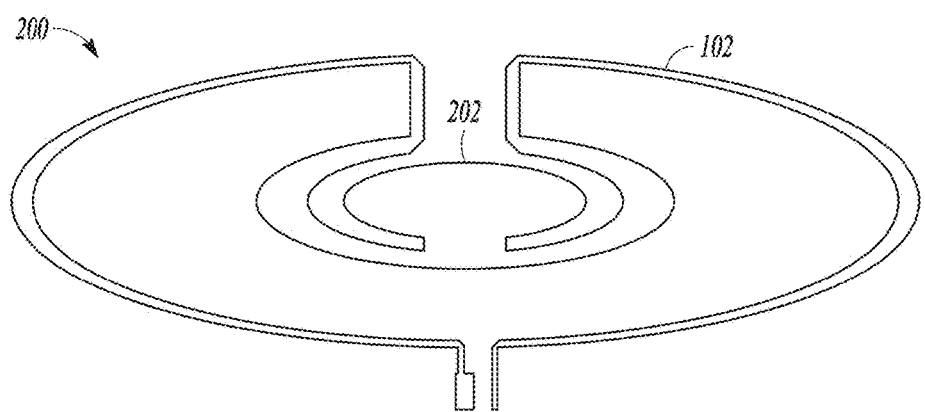
FIG. 2 illustrates generally an example of a planar antenna pattern, such as included as a portion of a PCB assembly.

FIG. 2 illustrates generally an example of a planar antenna pattern 200, such as can be included as a portion of a PCB assembly. In an example, a conductive loop 102, similar to the conductive loop 102 of FIG. 1, can include a stub 202. The stub 202 can be sized and shaped to tune an antenna assembly including the conductive loop 102, such as to adjust one or more of an input impedance or a specified usable range of frequencies.

Figure 3A:
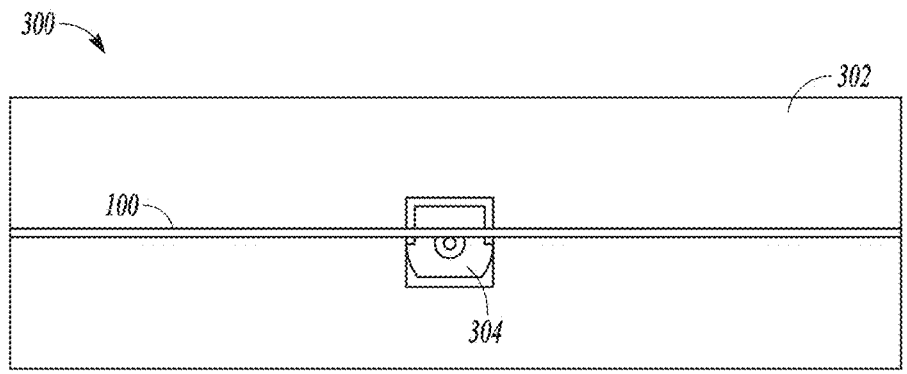
FIGS. 3A through 3C illustrate generally views of an example of a planar antenna assembly electrically and mechanically coupled to a PCB assembly.
Figure 3B:
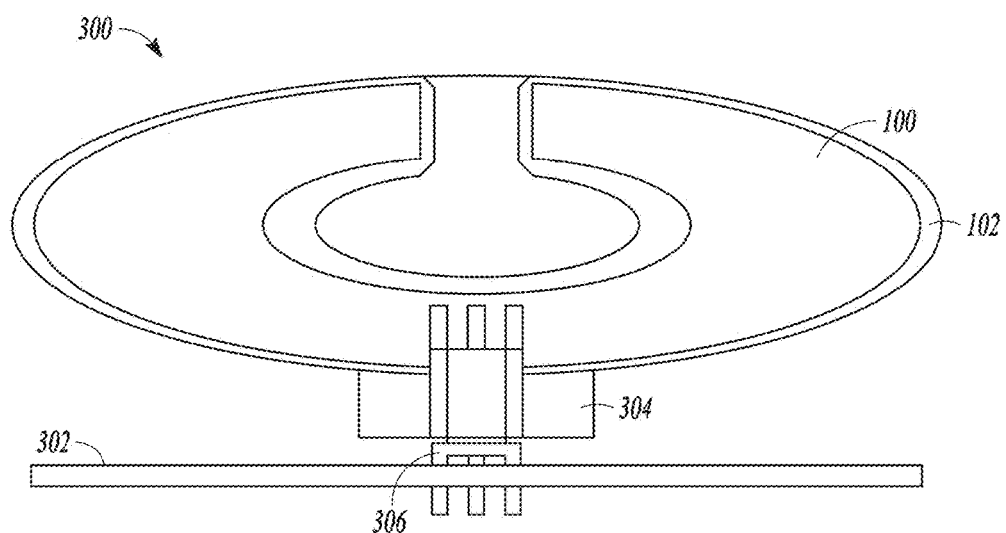
Figure 3C:
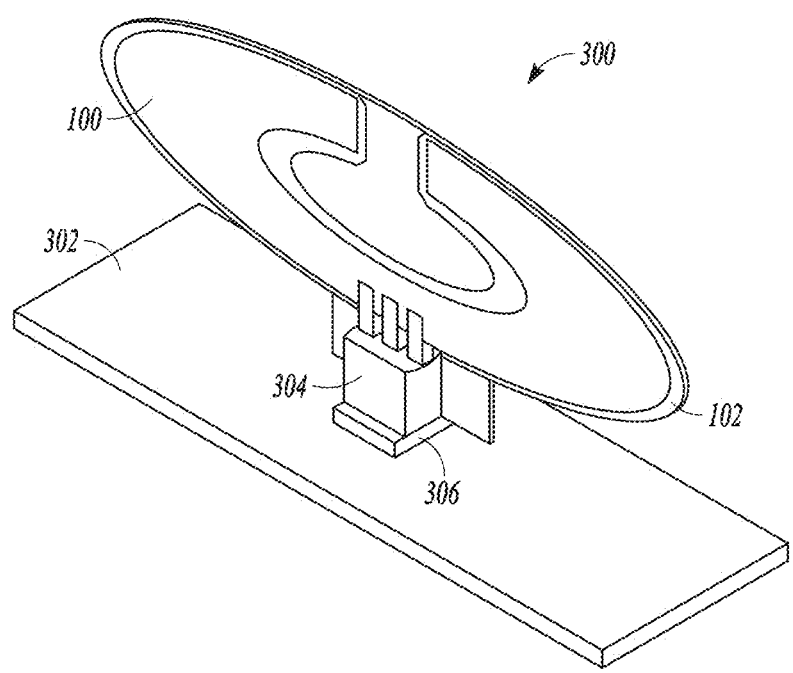

FIGS. 3A through 3C illustrate generally views of an example 300 of a planar antenna assembly 100 that can be electrically and mechanically coupled to a PCB assembly 302. In an example, the planar antenna assembly 100 can include a conductive loop 102, such as discussed in the examples above and below.

FIG. 3A illustrates generally an overhead (e.g., plan) view, FIG. 3B illustrates generally a side (e.g., elevation) view, and FIG. 3 illustrates generally a isometric view. In an example, the PCB assembly 302 can include a first PCB assembly comprising an electrical connector 306, such as including a through-hole MCX connector, or one or more other connectors (e.g., a connector suitable for a radio frequency (RF) application). Such a connector can be configured to mechanically and electrically couple a second PCB assembly, such as the planar antenna assembly 100, to the first PCB assembly 302, such as using a mating connector 304 that can be included as a portion of the planar antenna assembly 100. Such a mating connector can include an end-launch configuration, such as to orient the planar antenna assembly 100 at an approximately ninety-degree angle (or in another specified orientation) with respect to the first PCB assembly 302.

In an example, the first PCB assembly 302 can include a conductive layer or plane region (e.g., a solid conductive sheet, or other conductive pattern such as a grid, or other pattern) such as coupled to one or more outer conductive portions of the electrical connector 306, such as to provide a reference plane or counterpoise for the planar antenna 100.

In an example, one or more of the first PCB assembly 302 or the planar antenna assembly 100 can include a dielectric material. Such a dielectric material can include a glass-epoxy laminate such as FR-4, or one or more other materials, such as generally used in PCB fabrication. Such materials can include a bismaleimide-triazine (BT) material, a cyanate ester, a polyimide material, or a polytetrafluoroethylene material, or one or more other materials. One or more of the conductive portions of the first PCB assembly 302 or the planar antenna assembly 100 can include electrodeposited or rolled-annealed copper or another conductive material. Such conductive portions can be patterned using a photolithographic process, or formed using one or more other techniques (e.g., a deposition, a stamping, etc.).

FIG. 4 illustrates generally an illustrative example of a voltage standing wave ratio (VSWR) 400 simulated for the antenna configuration of FIG. 1. A usable range of operating frequencies can be specified in terms of VSWR, or in terms of a corresponding return loss, or using one or more other criteria. For example, a specified $S_{11}$ parameter of about −6 dB or lower (e.g., a return loss of 6 dB), can be considered generally acceptable for a cellular or mobile data application. Such a return loss corresponds to a VSWR of 3:1 or less (e.g., about 3.01 or less as indicated in FIG. 4).

In FIG. 4, the simulated antenna can provide two or more usable ranges of operating frequencies, such as a first region 402 covering a range from less than about 806 MHz to more than 960 MHz, or a second region 404 covering a range from less than about 1.575 GHz to more than about 2.170 GHz. Other ranges can be used, such as one or more sub-ranges within the first range 402, or the second range 404, or by changing one or more dimensions of conductive loop pattern of the antenna (e.g., such as increasing a major dimension of one or more conic portions to shift a range of operating frequencies lower or vice versa). In the example of FIG. 4, the usable operating frequency ranges are non-overlapping, because there is a region of high VSWR between the first range 402 and the second range 404.

Other criteria can also be used, such as a return loss of 10 dB or better (corresponding to a VSWR of 2:1 or less), or using one or more other values, with a corresponding improvement in link budget due to reduced mismatch loss, but at a corresponding cost in terms of manufacturing yield or usable bandwidth.

In an example, a first specified range of operating frequencies can include one or more cellular communications frequency ranges, such as a Global System for Mobile communication (GSM) range of frequencies, such as including one or more of T-GSM-810, GSM-850, P-GSM-900, E-GSM-900, R-GSM-900, or T-GSM-900, such as including a range of about 806 MHz to about 960 MHz. A second, different, specified range of operating frequencies can include one or more other cellular communications frequency ranges, such as including one or more of DCS-1800 or PCS-1900, such as including a range from about 1710 MHz to about 1990 MHz, or including one more or other ranges.

Figure 5:
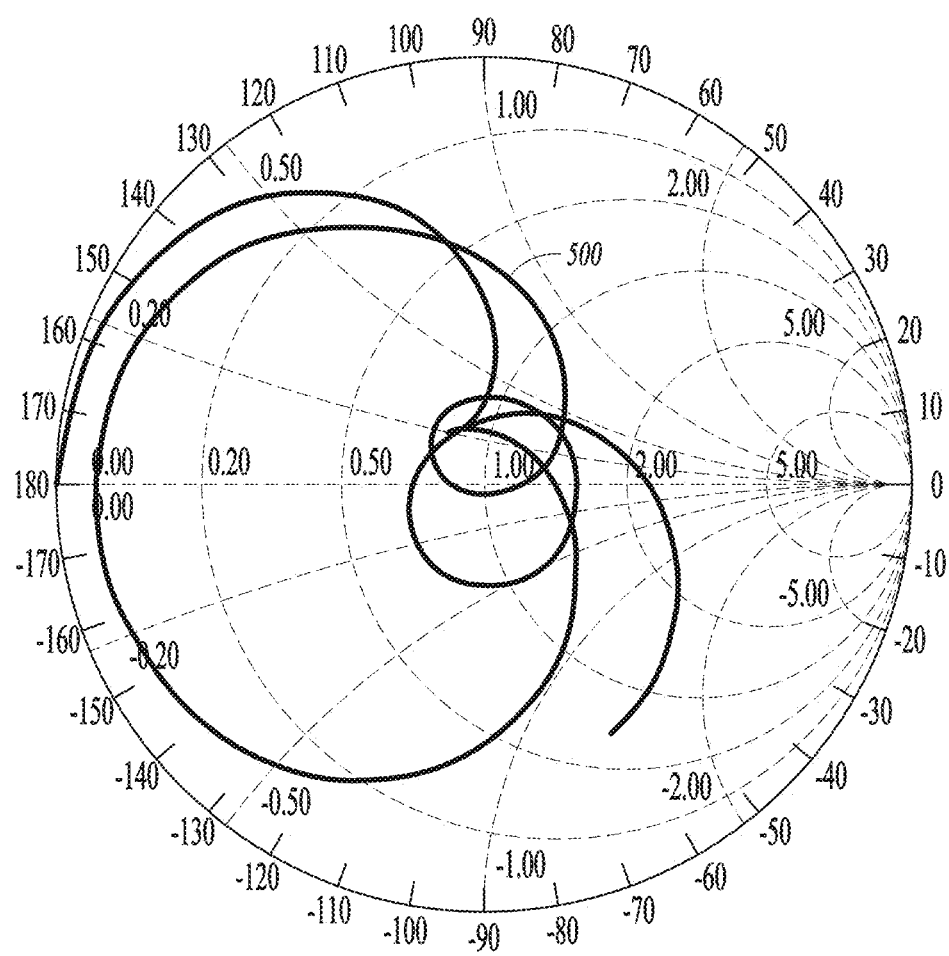
FIG. 5 illustrates generally an illustrative example of an impedance Smith Chart simulated for the antenna configuration of FIG. 1.

FIG. 5 illustrates generally an illustrative example of an impedance Smith Chart 500 simulated for the antenna configuration of FIG. 1. In the example of FIG. 5, loops in the impedance response can be provided by a multiply-resonant antenna structure, such as shown in the simulated return loss of the illustrative example of FIG. 4. In the example of FIG. 5, loops in the impedance response encircle the center or unit impedance of the chart (e.g., corresponding to 50 ohms real impedance).

As discussed above, the geometry of the conductive loop portions (e.g., a dimension of an inner or outer conic portion, or a lateral width of the conductive strip forming the loop, or one or more other physical parameters) can be adjusted, such as parametrically studied via simulation to achieve a desired input impedance range. In the case where the desired input impedance is not easily achieved, a matching structure such as one or more discrete or distributed matching components can be used to minimize or reduce the impedance discontinuity between the antenna and a wireless communication circuit coupled to the antenna via the matching structure, or to adjust the input impedance presented to the wireless communication circuit.

Figure 6:
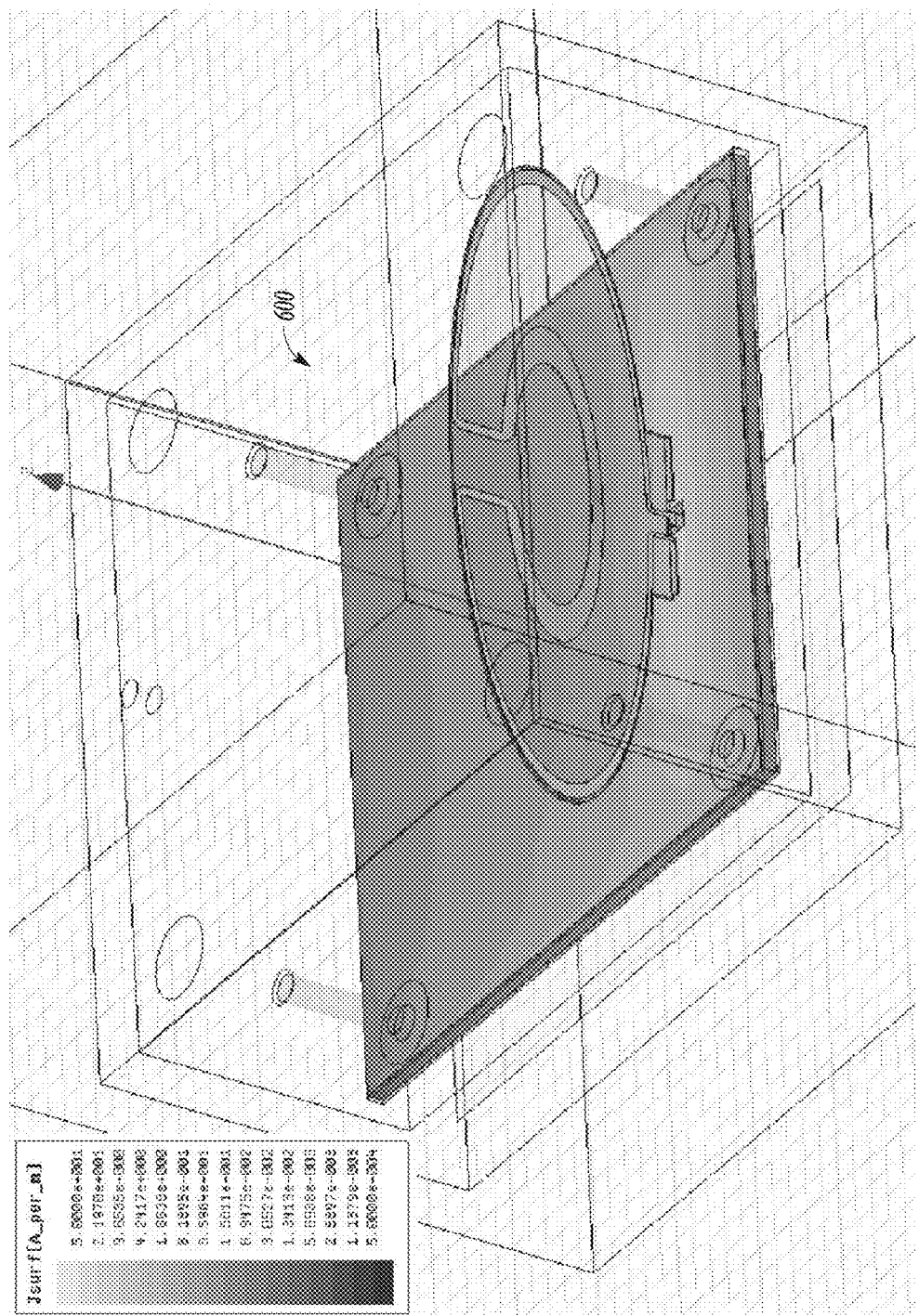
FIG. 6 illustrates generally an illustrative example of a surface current density simulated for the antenna configuration of FIG. 1 at a frequency of 880 megahertz (MHz).

FIG. 6 illustrates generally an illustrative example 600 of a surface current density simulated for the antenna configuration of FIG. 1 at a frequency of 880 megahertz (MHz). In FIG. 6, the antenna is located at a ninety degree angle with respect to a reference plane provided by a separate circuit assembly. Such an antenna orientation can improve radiation efficiency as compared to placing the antenna assembly parallel to the reference plane. For example, a simulated radiation efficiency for antenna configuration of FIG. 6 is about 90% at 880 MHz.

Figure 7:
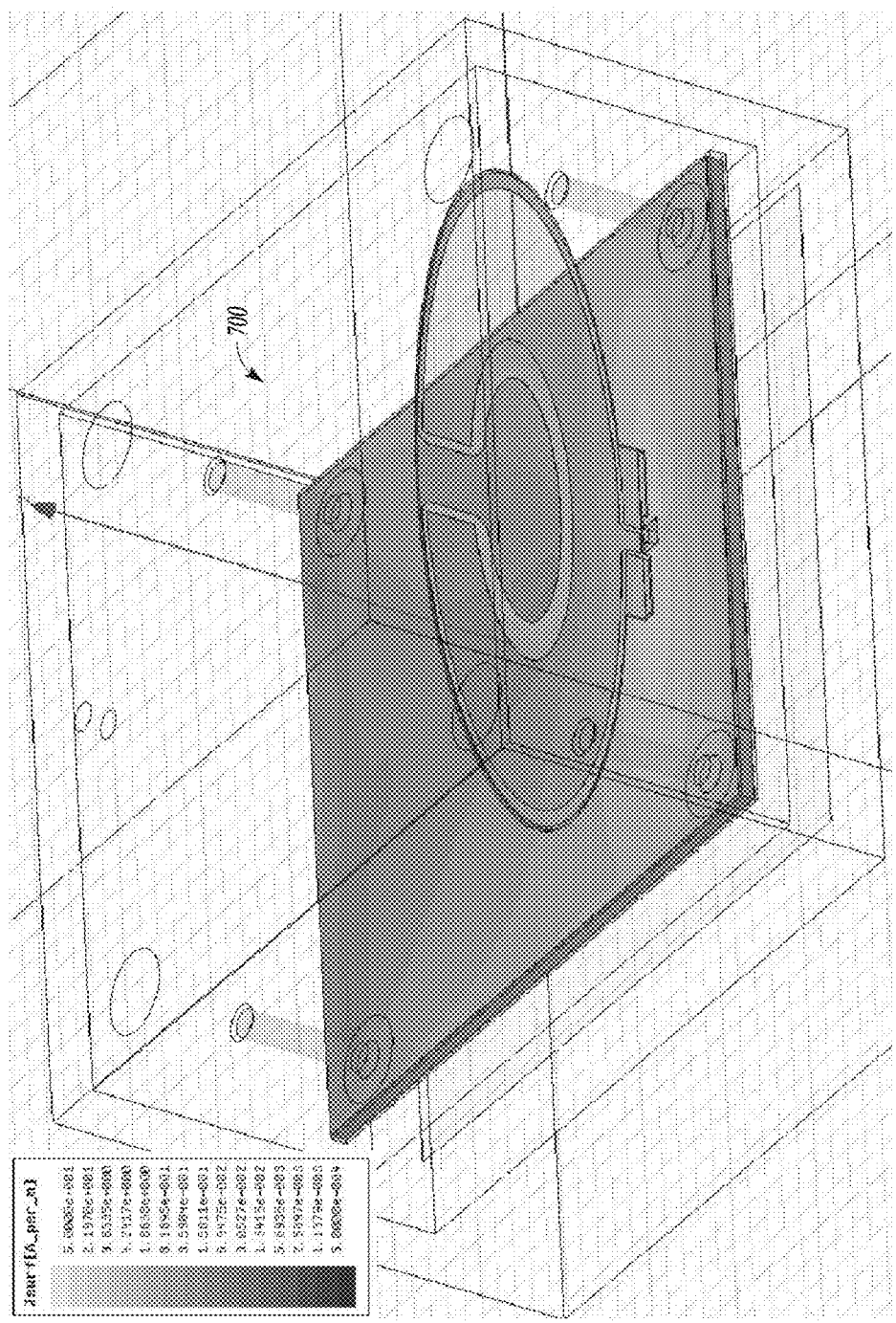
FIG. 7 illustrates generally an illustrative example of a surface current density simulated for the antenna configuration of FIG. 1 at a frequency of 1710 megahertz (MHz).

FIG. 7 illustrates generally an illustrative example of a surface current density simulated for the antenna configuration of FIG. 1 at a frequency of 1710 megahertz (MHz). In FIG. 7, the antenna is located at a ninety degree angle with respect to a reference plane provided by a separate circuit assembly, similar to the configuration shown in FIG. 6. A simulated radiation efficiency for antenna configuration of FIG. 6 is about 93% at 1710 MHz.

Figure 8:
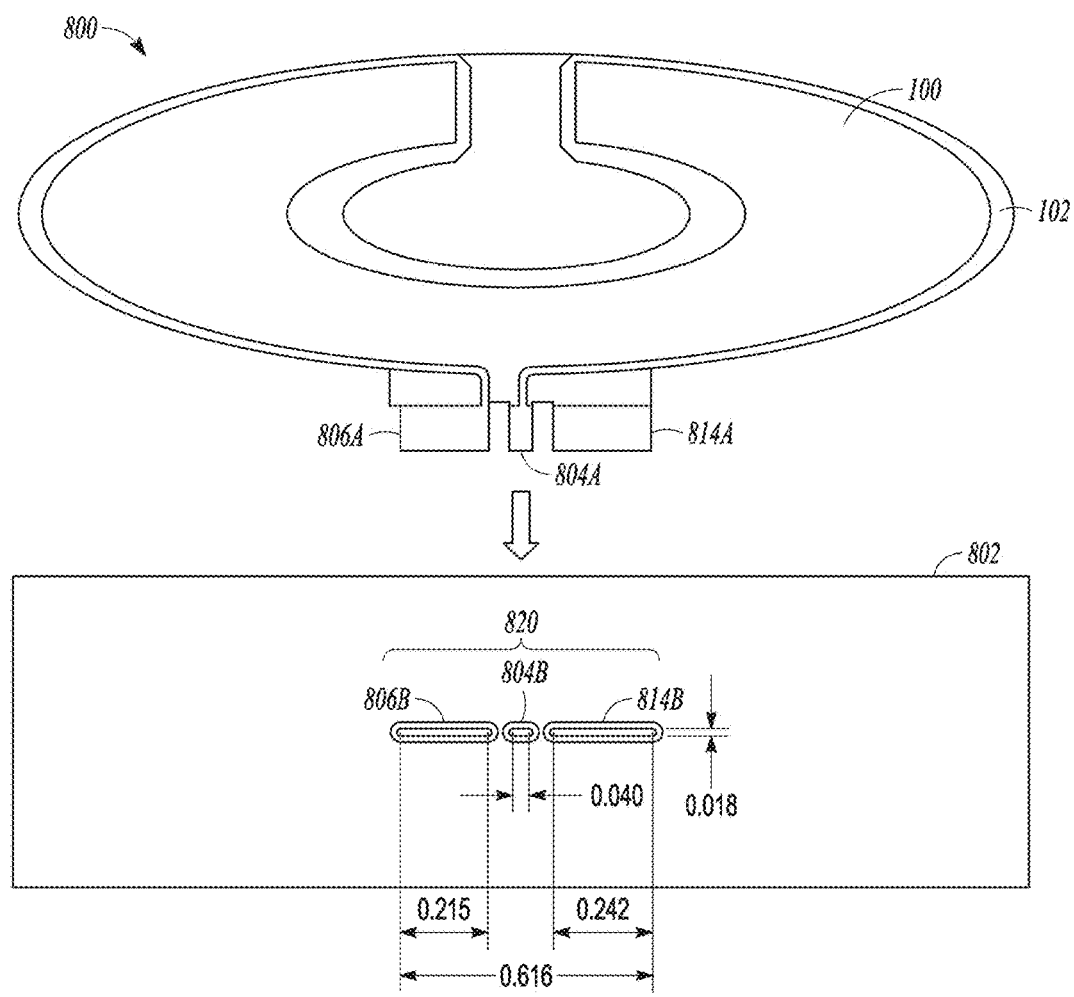
FIG. 8 illustrates generally an example of an antenna assembly configured to be electrically and mechanically coupled to a PCB assembly using an embedded electrical connector.

FIG. 8 illustrates generally an example of an apparatus 800. The apparatus 800 can include an antenna assembly 100 configured to be electrically and mechanically coupled to a PCB assembly 802 using an embedded electrical connector 820. The antenna assembly 100 can include an approximately planar antenna, such as including a conductive loop 102 formed on a surface or interior layer of a printed circuit assembly including a dielectric material, as discussed in the examples above and below.

The present inventors have recognized, among other things, that the RF connector, such as shown in the example of FIGS. 3A through 3C can add cost and complexity to the apparatus 800. Instead, the PCB assembly 802 can include the embedded electrical connector 820, such as including one or more receptacles configured to accept corresponding tab-shaped portions of the antenna assembly 100. For example, a first outer tab-shaped portion of the antenna assembly 100 can be configured to mate with a first outer conductive receptacle 806B of the PCB assembly 802. Such mating can include an interference fit, or a loose fit that can be mechanically and electrically secured such as using a soldered joint or a conductive adhesive. Similarly, the antenna assembly 100 can include a second outer tab-shaped portion 814A, such as configured to mate with a second conductive outer receptacle 814B of the PCB assembly 802, and a center conductive portion 804A such as configured to mate with a center conductive receptacle 804B that can be located laterally between the first conductive outer receptacle 806B and the second conductive outer receptacle 814B.

In an example, one or more of the first conductive outer receptacle 806B, the second conductive outer receptacle 814B, or the center conductive receptacle 804B can include plated through-holes included as a portion of the PCB assembly 802. Such receptacles can be coupled to other circuitry located on or nearby the PCB assembly 802, such as via a waveguide or transmission line structure included as a portion of the PCB assembly (e.g., including using a coplanar waveguide, a microstrip line, a planar strip line, or a buried strip line).

In an example, such an embedded connector 820 need not include any discrete connector assembly such as a housing, plastic shell, pins, or other externally-applied components. For example, the embedded connector 820 can be formed or fabricated as a portion of the PCB assembly 802 generally using techniques that can be used for fabricating other portions of the PCB assembly 802, such as plasma etching, laser cutting, or mechanically drilling one or more holes, laminating one or more dielectric or conductive layers together, plating or lining one or more holes with a conductor, or lithographically or mechanically patterning conductive shapes in one or more conductive layers. In this manner, the assembly step of attaching a connector assembly (e.g., such as shown in FIGS. 3A through 3C) to both the PCB assembly 802 and the antenna assembly 100 can be eliminated, such as reducing inventory carrying requirements and cost.

The second tab-shaped portion 814A need not include a conductor that is connected to the conductive loop 102 of the antenna assembly 100. For example, the second tab-shaped portion 814A can provide a mechanical "key" to prevent insertion of the antenna assembly 100 into the embedded connector 820 if the antenna assembly 100 is not oriented correctly, or to prevent subsequent rotation of the antenna assembly 100 after mating. In an example, the second conductive outer receptacle 814B can be a different shape or size than the first conductive outer receptacle 806B, such as laterally wider than the first conductive outer receptacle 806B.

In an example, one or more of the PCB assembly 802 or the antenna assembly 100 can include a rigid or flexible dielectric material. For example, the PCB assembly 802 can include a rigid dielectric material (e.g., a glass-epoxy laminate such as FR-4), and the antenna assembly 100 can include a flexible dielectric material (e.g., a polyimide material or other flexible dielectric). In an example, the antenna assembly 100 can include a flexible dielectric material in some regions, and a rigid material in some regions, such as including a rigid material (e.g., a stiffener) in one or more of the tab-shaped regions of the antenna assembly 100 to provide mechanical rigidity or to maintain desired dimensional constrains during mating of the antenna assembly 100 to the PCB assembly 802.

In an example, such as using one or more of the conductive outer receptacles as a "ground" or reference conductor, the embedded electrical connector 820 can provide a waveguide or transmission line structure, such as to establish a desired characteristic impedance (in the example of a transmission line structure). The antenna assembly 100 can be similarly customized, such as to provide a characteristic impedance that can reduce or eliminate one or more discrete or distributed matching components.

Figure 9A:
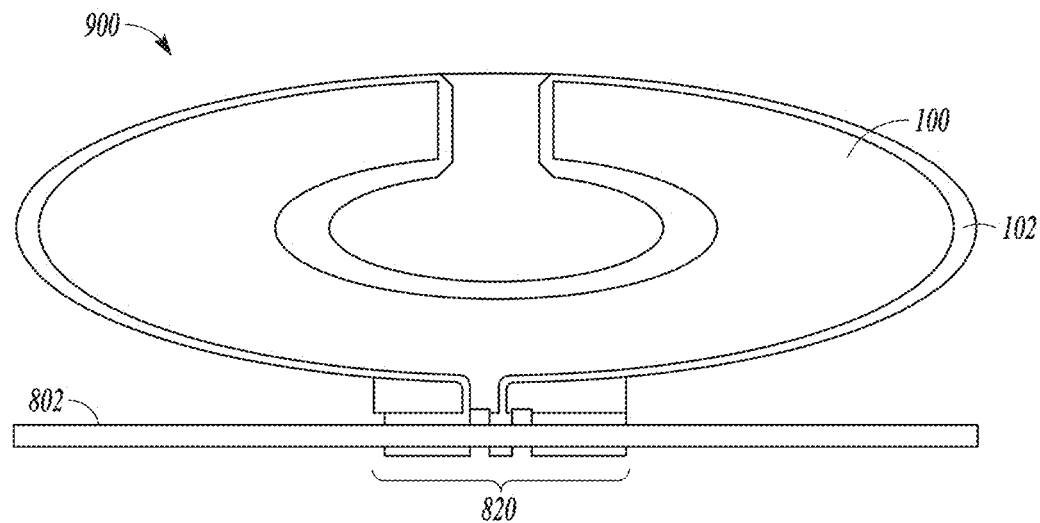
FIGS. 9A through 9B illustrate generally views of an example of an antenna assembly coupled to a PCB assembly.
Figure 9B:
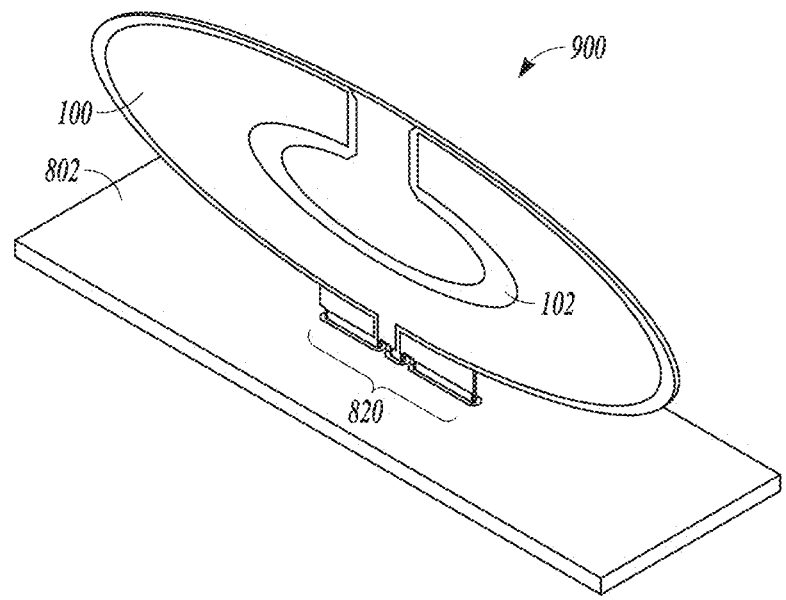

FIGS. 9A through 9B illustrate generally views of an example 900 of an antenna assembly 100 coupled to a PCB assembly 802, such as using an embedded electrical connector 820 included as a portion of the PCB assembly 802. As in the example of FIG. 8, above, the antenna assembly 100 can be configured to mate with the embedded electrical connector 820, such as when the antenna assembly 100 is aligned in a specified orientation. In an example, the PCB assembly 802 can include a reference plane or other conductive layer or region, such as to provide a counterpoise for operation of the antenna assembly 100. In an example, the antenna assembly 100 can include an approximately planar conductive loop 102 as discussed in the examples above and below.

Figure 10:
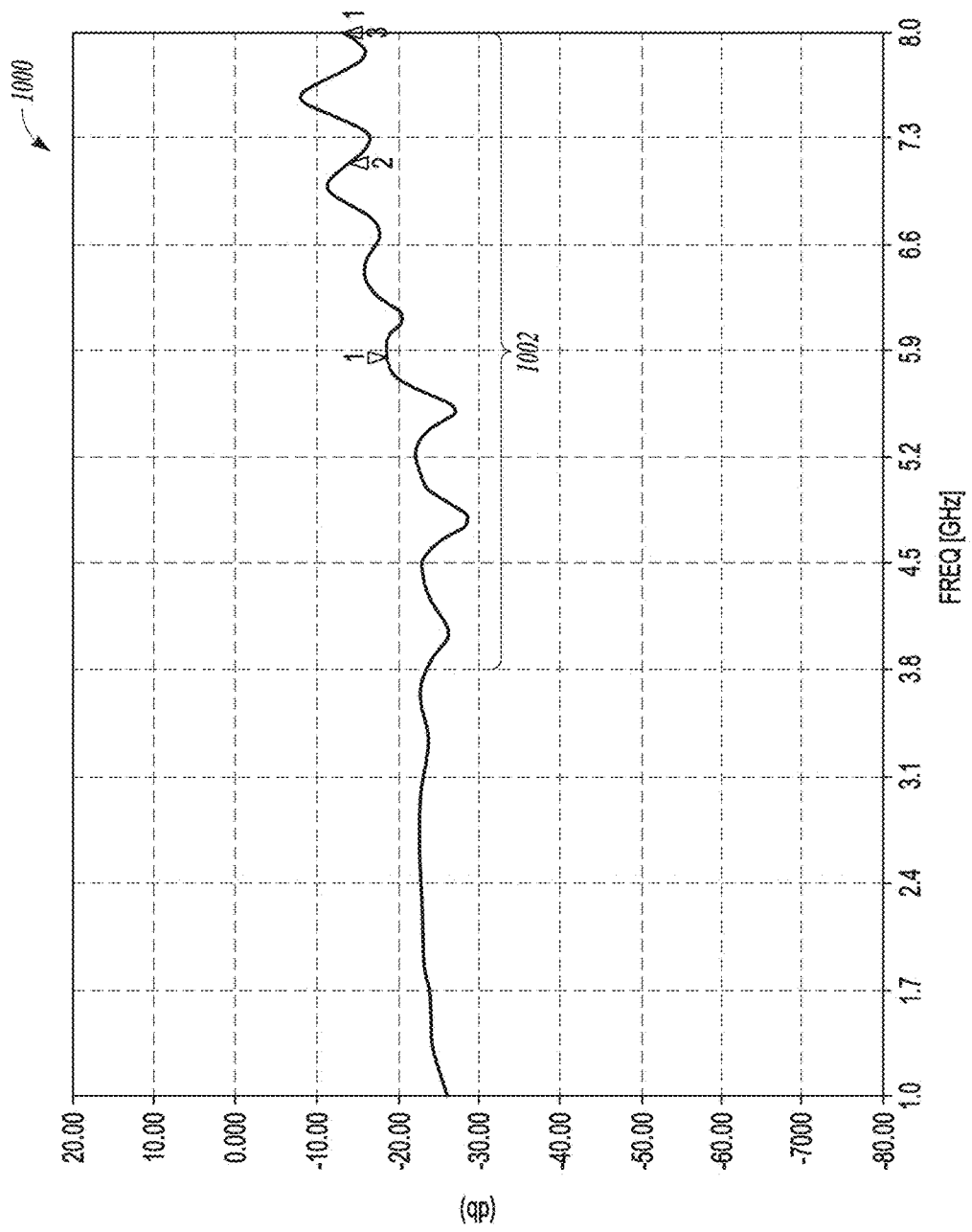
FIG. 10 illustrates generally an illustrative example of a return loss measured on an interconnect such as including portions of a first and second PCB assembly, such as similar to the configuration of FIGS. 8 and 9A through 9B.

FIG. 10 illustrates generally an illustrative example of a return loss 1000 measured on an interconnect such as including portions of a first and second PCB assembly, such as similar to the configuration of FIGS. 8 and 9A through 9B. In the example of FIG. 10, a return loss of the embedded electrical connector (e.g., a mated pair of the tab shaped portions of an antenna assembly and the embedded electrical connector, such as shown in FIG. 8) provides an $S_{11}$ parameter of −10 dB or better (e.g., more negative) in a range from less than 1 GHz to more than 7 GHz. If a −6 dB criterion is used, such a range extends from less than 1 GHz to more than 8 GHz. Ripple in the region 1002 beyond about 4 GHz is believed to be attributable not to decreased return loss performance, but rather to a phase error associated with a small difference in total path length between a calibration standard used for calibrating the network analyzer, and the actual path length of the measured interconnect structure.

Figure 11:
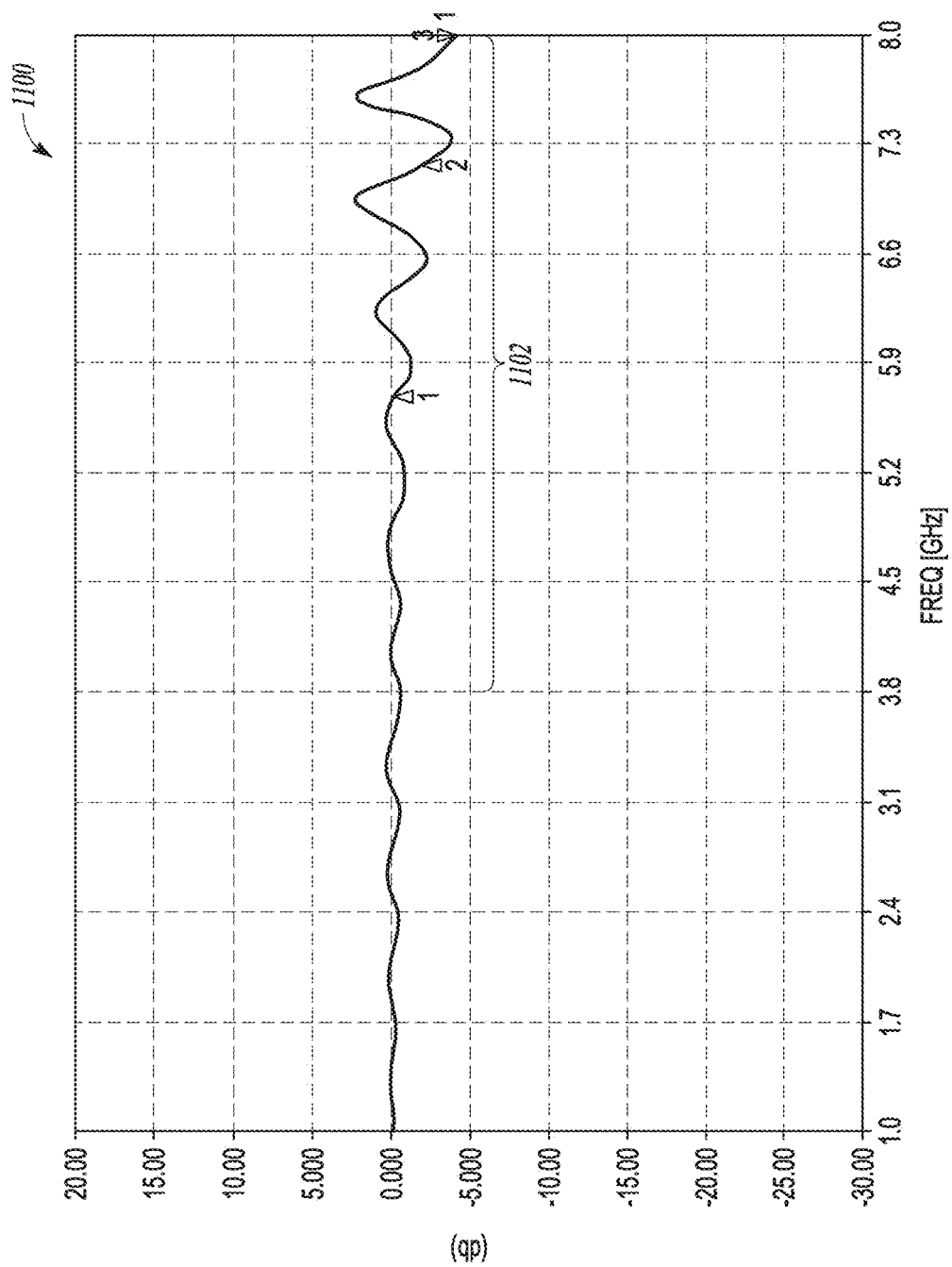
FIG. 11 illustrates generally an illustrative example of a transmission loss measured on an interconnect such as including portions of a first and second PCB assembly, such as similar to the configuration of FIGS. 8 and 9A through 9B.

FIG. 11 illustrates generally an illustrative example of a transmission loss 1100 measured on an interconnect such as including portions of a first and second PCB assembly, such as similar to the configuration of FIGS. 8 and 9A through 9B. In the example of FIG. 11, a transmission loss of the embedded electrical connector (e.g., a mated pair of the tab shaped portions of an antenna assembly and the embedded electrical connector, such as shown in FIG. 8) provides an $S_{21}$ parameter of −3 dB or better (e.g., more positive) in a range from less than 1 GHz to more than 5 GHz. Ripple in the region 1102 beyond about 5 GHz is believed to be attributable not to decreased transmission loss performance, but rather to a phase error associated with a small difference in total path length between a calibration standard used for calibrating the network analyzer, and the actual path length of the measured interconnect structure. For example, such ripple shows a positive $S_{21}$ parameter in certain regions, which would not be expected in a passive device, so such ripple is believed to be attributable to measurement error.

In FIG. 10, the return loss is less than about −18 dB in a range from less than about 1 GHz to more than about 6 GHz, and in FIG. 11, a corresponding transmission loss is less than about 0.2 dB in the same range of frequencies. It is believed that such return loss and transmission loss performance can be attributed at least in part to the distributed reactance of the embedded connector structure, and such losses can be indicative that the embedded connector performance is comparable to a generally-available off-the-shelf discrete connector. Such an embedded connector can be fabricated in part using an FR-4 board material, and despite the dielectric losses associated with such material, can still provide useful operation to beyond 6 GHz.

Figure 12:
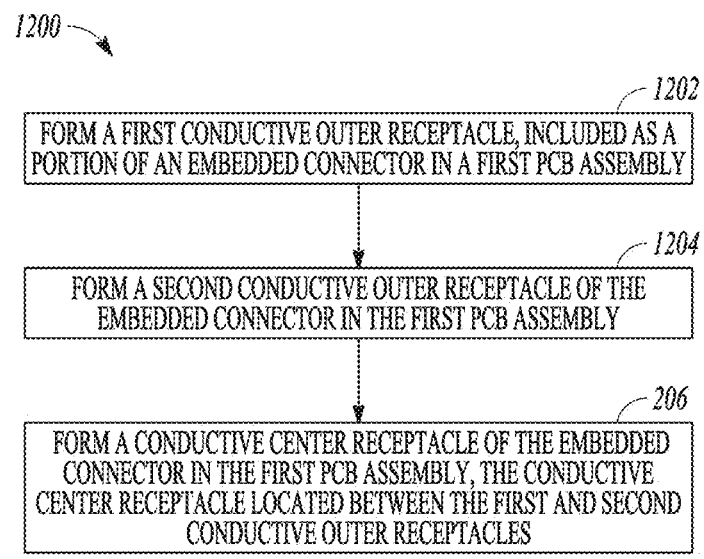
FIG. 12 illustrates generally a technique 1200, such as a method, that can include forming a first PCB assembly.

FIG. 12 illustrates generally a technique 1200, such as a method, that can include forming a first PCB assembly, such as a PCB assembly including an embedded connector as shown in the examples above or below.

At 1202, the technique 1200 can include forming a first conductor outer receptacle, such as included as a portion of an embedded connector in a first PCB assembly. At 1204, the technique 1200 can include forming a second conductive outer receptacle of the embedded connector in the first PCB assembly. At 1206, the technique 1200 can include forming a conductive center receptacle of the embedded connector. In an example, the conductive center receptacle can be located between the first and second conductive outer receptacles. For example, the first and second conductive outer receptacles and the conductive center receptacle can be configured to receive the tab-shaped portion of the second PCB assembly.

VARIOUS NOTES & EXAMPLES

Example 1 includes subject matter, such as an apparatus, comprising a first printed circuit board (PCB) assembly comprising an embedded electrical connector configured to be mechanically coupled to a corresponding tab-shaped portion of a second PCB assembly, and configured to permit insertion of the tab-shaped portion of the second PCB assembly into the embedded electrical connector when the second PCB assembly is aligned in a specified orientation. In Example 1, the embedded electrical connector comprises first and second conductive outer receptacles and a conductive center receptacle, the first and second conductive outer receptacles and the conductive center receptacle are configured to receive the tab-shaped portion of the second PCB assembly, and the conductive center receptacle is located between the first and second conductive outer receptacles.

In Example 2, the subject matter of Example 1 can optionally include a conductive center receptacle located laterally between the first and second conductive outer receptacles.

In Example 3, the subject matter of one or any combination of Examples 1 through 2 can optionally include a second conductive outer receptacle including one or more of a shape or a dimension that is different from the first outer receptacle.

In Example 4, the subject matter of one or any combination of Examples 1 through 3 can optionally include respective conductive receptacles comprising respective plated through-holes included as a portion of the first PCB assembly.

In Example 5, the subject matter of one or any combination of Examples 1 through 4 can optionally include conductive receptacles fed via a coplanar waveguide structure included as a portion of the first PCB assembly.

In Example 6, the subject matter of one or any combination of Examples 1 through 5 can optionally include a return loss of the three receptacles and the tab-shaped portions of the second PCB assembly of about −18 decibels (dB) or more negative, and a transmission loss of less than about 0.2 (dB), in a range of operating frequencies from less than 1 gigahertz (GHz) to more than about 6 GHz, when the tab-shaped portion is mated to the embedded electrical connector.

In Example 7, the subject matter of one or any combination of Examples 1 through 6 can optionally include a combination of the first and second conductive outer receptacles and the center conductive receptacle configured to provide a waveguide or a transmission line structure.

In Example 8, the subject matter of one or any combination of Examples 1 through 7 can optionally include a second PCB assembly, the second PCB assembly including an approximately planar antenna.

In Example 9, the subject matter of one or any combination of Examples 1 through 8 can optionally include a tab-shaped portion of the second PCB assembly comprising two or more tabs including a first tab configured to be mechanically and electrically coupled to the first conductive outer receptacle of the first PCB assembly, and a second tab configured to mechanically and electrically coupled to the center conductive receptacle of the first PCB assembly.

In Example 10, the subject matter of one or any combination of Examples 1 through 9 can optionally include a tab-shaped portion of the second PCB assembly comprising a third tab configured to fit exclusively in the second conductive outer receptacle of the first PCB assembly.

In Example 11, the subject matter of one or any combination of Examples 1 through 10 can optionally include an approximately planar antenna comprising a dielectric material, and a conductive loop comprising an outer loop portion comprising a first conic section and an inner loop portion comprising a second conic section located within a footprint of the first conic section.

In Example 12, the subject matter of one or any combination of Examples 1 through 11 can optionally include one or more of the first or second conic sections comprising an elliptical shape.

In Example 13, the subject matter of one or any combination of Examples 1 through 12 can optionally include a lateral width of the conductive loop that is widest in a region along a major axis of the first or second conic section.

In Example 14, the subject matter of one or any combination of Examples 1 through 13 can optionally include a line width of the conductive loop that varies along the conductive loop.

In Example 15, the subject matter of one or any combination of Examples 1 through 14 can optionally include an outer loop portion that originates from a region of the second PCB assembly, the region configured to be coupled to the embedded electrically connector of the first PCB assembly.

In Example 16, the subject matter of one or any combination of Examples 1 through 15 can optionally include a first PCB assembly comprising a planar conductive region electrically coupled to at least one of the conductive receptacles, the planar conductive region configured to provide a reference plane for the approximately planar antenna.

In Example 17, the subject matter of one or any combination of Examples 1 through 16 can optionally include a first PCB assembly includes a rigid dielectric material, wherein the second PCB assembly includes at least a portion comprising a flexible dielectric material, and wherein the tab-shaped portion of the second PCB includes a rigid dielectric material.

Example 18 includes subject matter, such as an apparatus, comprising a first printed circuit board (PCB) assembly, a second PCB assembly including an approximately planar antenna, the first PCB assembly comprising an embedded electrical connector configured to be mechanically coupled to a corresponding tab-shaped portion of a second PCB assembly, and configured to permit insertion of the tab-shaped portion of the second PCB assembly into the embedded electrical connector when the second PCB assembly is aligned in a specified orientation, the embedded electrical connector comprising first and second conductive outer receptacles and a conductive center receptacle, the first and second conductive outer receptacles and the conductive center receptacle configured to receive the tab-shaped portion of the second PCB assembly, the conductive center receptacle located between the first and second conductive outer receptacles, and the tab-shaped portion of the second PCB assembly comprising two or more tabs including a first tab configured to be mechanically and electrically coupled to the first conductive outer receptacle of the first PCB assembly, and a second tab configured to mechanically and electrically coupled to the center conductive receptacle of the first PCB assembly.

In Example 19, the subject matter of Example 18 can optionally include a conductive center receptacle located laterally between the first and second conductive outer receptacles.

Example 20 can include, or can optionally be combined with the subject matter of one or any combination of Examples 1-19 to include, subject matter (such as a method, a means for performing acts, or a machine-readable medium including instructions that, when performed by the machine, cause the machine to perform acts) comprising forming a first PCB assembly comprising an embedded electrical connector configured to be mechanically coupled to a corresponding tab-shaped portion of a second PCB assembly, and configured to permit insertion of the tab-shaped portion of the second PCB assembly into the embedded electrical connector when the second PCB assembly is aligned in a specified orientation, the forming the first PCB assembly includes forming a first conductive outer receptacle, forming a second conductive outer receptacle, and forming a conductive center receptacle, the conductive center receptacle located between the first and second conductive outer receptacles. In Example 20, the first and second conductive outer receptacles and the conductive center receptacle are configured to receive the tab-shaped portion of the second PCB assembly.

In Example 21, the subject matter of Example 20 can optionally include a conductive center receptacle located laterally between the first and second conductive outer receptacles.

In Example 22, the subject matter of one or any combination of Examples 20 through 21 can optionally include forming a second PCB assembly, the second PCB assembly including an approximately planar antenna, and mating the first PCB assembly comprising the embedded electrical connector to the corresponding tab-shaped portion of the second PCB assembly, including inserting the tab-shaped portion of the second PCB assembly into the embedded electrical connector when the second PCB assembly is aligned in the specified orientation.

In Example 23, the subject matter of one or any combination of Examples 20 through 22 can optionally include forming a second PCB assembly including forming an approximately planar loop antenna comprising a dielectric material, and a conductive loop comprising an outer loop portion comprising a first conic section and an inner loop portion comprising a second conic section located within a footprint of the first conic section.

In Example 24, the subject matter of one or any combination of Examples 20 through 23 can optionally include mating comprising mechanically and electrically bonding the embedded electrical connector of the first PCB assembly to the tab-shaped portion of the second PCB assembly using a solder joint.

Example 25 can include, or can optionally be combined with any portion or combination of any portions of any one or more of Examples 1-24 to include, subject matter that can include means for performing any one or more of the functions of Examples 1-24, or a machine-readable medium including instructions that, when performed by a machine, cause the machine to perform any one or more of the functions of Examples 1-24.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An apparatus comprising:
a first printed circuit board (PCB) assembly comprising an embedded electrical connector configured to be mechanically coupled to a corresponding tab-shaped portion of a second PCB assembly, and configured to permit insertion of the tab-shaped portion of the second PCB assembly into the embedded electrical connector when the second PCB assembly is aligned in a specified orientation;
wherein the embedded electrical connector comprises first and second conductive outer receptacles and a conductive center receptacle, the first and second conductive outer receptacles each having an opening size that is greater than an opening size of the conductive center receptacle;
wherein the first and second conductive outer receptacles and the conductive center receptacle are configured to receive the tab-shaped portion of the second PCB assembly; and
wherein the conductive center receptacle is located between the first and second conductive outer receptacles.

2. The apparatus of claim 1, wherein the conductive center receptacle is located laterally between the first and second conductive outer receptacles.

3. The apparatus of claim 1, wherein the second conductive outer receptacle includes one or more of a shape or a dimension that is different from the first conductive outer receptacle.

4. The apparatus of claim 1, wherein the respective conductive receptacles comprise respective plated through-holes included as a portion of the first PCB assembly.

5. The apparatus of claim 1, wherein the conductive receptacles are fed via a coplanar waveguide structure included as a portion of the first PCB assembly.

6. The apparatus of claim 1, wherein a return loss of the conductive receptacles and the tab-shaped portions of the second PCB assembly is about −18 decibels (dB) or more negative, and wherein a transmission loss is less than about 0.2 (dB), in a range of operating frequencies from less than 1 gigahertz (GHz) to more than about 6 GHz, when the tab-shaped portion is mated to the embedded electrical connector.

7. The apparatus of claim 1, wherein the combination of the first and second conductive outer receptacles and the center conductive receptacle is configured to provide a waveguide or a transmission line structure.

8. The apparatus of claim 1, further comprising the second PCB assembly;
wherein the second PCB assembly includes an approximately planar antenna.

9. The apparatus of claim 8, wherein the tab-shaped portion of the second PCB assembly comprises two or more tabs including a first tab configured to be mechanically and electrically coupled to the first conductive outer receptacle of the first PCB assembly, and a second tab configured to be mechanically and electrically coupled to the center conductive receptacle of the first PCB assembly.

10. The apparatus of claim 9, wherein the tab-shaped portion of the second PCB assembly comprises a third tab configured to fit exclusively in the second conductive outer receptacle of the first PCB assembly.

11. The apparatus of claim 8, wherein the approximately planar antenna comprises:
a dielectric material; and
a conductive loop comprising:
an outer loop portion comprising a first conic section; and
an inner loop portion comprising a second conic section located within a footprint of the first conic section.

12. The apparatus of claim 11, wherein one or more of the first or second conic sections includes an elliptical shape.

13. The apparatus of claim 12, wherein a lateral width of the conductive loop is widest in a region along a major axis of the first or second conic section.

14. The apparatus of claim 11, wherein a line width of the conductive loop varies along the conductive loop.

15. The apparatus of claim 11, wherein the outer loop portion originates from a region of the second PCB assembly configured to be coupled to the embedded electrically connector of the first PCB assembly.

16. The apparatus of claim 8, wherein the first PCB assembly includes a planar conductive region electrically coupled to at least one of the conductive receptacles, the planar conductive region configured to provide a reference plane for the approximately planar antenna.

17. The apparatus of claim 8, wherein the first PCB assembly includes a rigid dielectric material, wherein the second PCB assembly includes at least a portion comprising a flexible dielectric material, and wherein the tab-shaped portion of the second PCB includes a rigid dielectric material.

18. An apparatus comprising:
a first printed circuit board (PCB) assembly; and
a second PCB assembly including an approximately planar antenna;
wherein the first PCB assembly comprises an embedded electrical connector configured to be mechanically coupled to a corresponding tab-shaped portion of a second PCB assembly, and configured to permit insertion of the tab-shaped portion of the second PCB assembly into the embedded electrical connector when the second PCB assembly is aligned in a specified orientation;
wherein the embedded electrical connector comprises first and second conductive outer receptacles and a conductive center receptacle, the first and second conductive outer receptacles each having an opening size that is greater than an opening size of the conductive center receptacle;
wherein the first and second conductive outer receptacles and the conductive center receptacle are configured to receive the tab-shaped portion of the second PCB assembly;
wherein the conductive center receptacle is located between the first and second conductive outer receptacles; and
wherein the tab-shaped portion of the second PCB assembly comprises two or more tabs including a first tab configured to be mechanically and electrically coupled to the first conductive outer receptacle of the first PCB assembly, and a second tab configured to be mechanically and electrically coupled to the center conductive receptacle of the first PCB assembly.

19. The apparatus of claim 18, wherein the conductive center receptacle is located laterally between the first and second conductive outer receptacles.

20. A method, comprising:
forming a first printed circuit board (PCB) assembly comprising an embedded electrical connector configured to be mechanically coupled to a corresponding tab-shaped portion of a second PCB assembly, and configured to permit insertion of the tab-shaped portion of the second PCB assembly into the embedded electrical connector when the second PCB assembly is aligned in a specified orientation;
wherein the forming the first PCB assembly includes:
forming a first conductive outer receptacle;
forming a second conductive outer receptacle; and
forming a conductive center receptacle, the conductive center receptacle located between the first and second conductive outer receptacles; and
wherein the first and second conductive outer receptacles and the conductive center receptacle are configured to receive the tab-shaped portion of the second PCB assembly, the first and second conductive outer receptacles each having an opening size that is greater than an opening size of the conductive center receptacle.

21. The method of claim 20, wherein the conductive center receptacle is located laterally between the first and second conductive outer receptacles.

22. The method of claim 20, further comprising:
forming the second PCB assembly, wherein the second PCB assembly includes an approximately planar antenna; and
mating the first PCB assembly comprising the embedded electrical connector to the corresponding tab-shaped portion of the second PCB assembly, including inserting the tab-shaped portion of the second PCB assembly into the embedded electrical connector when the second PCB assembly is aligned in the specified orientation.

23. The method of claim 22, wherein forming the second PCB assembly includes forming an approximately planar loop antenna including:
a dielectric material; and
a conductive loop comprising:
an outer loop portion comprising a first conic section; and
an inner loop portion comprising a second conic section located within a footprint of the first conic section.

24. The method of claim 22, wherein the mating comprises mechanically and electrically bonding the embedded electrical connector of the first PCB assembly to the tab-shaped portion of the second PCB assembly using a solder joint.

\* \* \* \* \*